United States Patent
Saji et al.

(10) Patent No.: US 10,601,395 B2
(45) Date of Patent: Mar. 24, 2020

(54) ELASTIC WAVE DEVICE, RADIO-FREQUENCY FRONT-END CIRCUIT, AND COMMUNICATION DEVICE

(71) Applicant: Murata Manufacturing Co., Ltd., Nagaokakyo-shi, Kyoto-fu (JP)

(72) Inventors: Mari Saji, Nagaokakyo (JP); Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 31 days.

(21) Appl. No.: 16/159,795

(22) Filed: Oct. 15, 2018

(65) Prior Publication Data

US 2019/0052244 A1 Feb. 14, 2019

Related U.S. Application Data

(63) Continuation of application No. PCT/JP2017/008839, filed on Mar. 6, 2017.

(30) Foreign Application Priority Data

May 13, 2016 (JP) ................................. 2016-097006

(51) Int. Cl.
*H03H 9/145* (2006.01)
*H03H 9/64* (2006.01)
(Continued)

(52) U.S. Cl.
CPC .... *H03H 9/14541* (2013.01); *H03H 9/02559* (2013.01); *H03H 9/02574* (2013.01);
(Continued)

(58) Field of Classification Search
CPC .. H03H 9/14541; H03H 9/6483; H03H 9/725; H03H 9/6476; H03H 9/02559;
(Continued)

(56) References Cited

U.S. PATENT DOCUMENTS 9,124,243 B2 *   9/2015  Tamasaki ........... H03H 9/02559
2008/0303379 A1  12/2008  Nakai et al.
(Continued)

FOREIGN PATENT DOCUMENTS

JP   2014-207540 A   10/2014
JP   2015-023474 A   2/2015
(Continued)

OTHER PUBLICATIONS

Official Communication issued in International Patent Application No. PCT/JP2017/008839, dated May 23, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes a first filter including an elastic wave resonator and a second filter connected to an antenna common terminal via a common node. When a first pass band of the first filter and second pass bands of the second filters are F1 and F2, respectively, F1<F2. The first filter includes at least one elastic wave resonator, and the elastic wave resonator uses Rayleigh waves propagating on a piezoelectric substrate made of $LiNbO_3$, IDT electrodes including a Pt film on a piezoelectric layer made of $LiNbO_3$, and a silicon oxide film covering the IDT electrodes. The thickness of the silicon oxide layer is about 33% or less of the wavelength of the IDT electrodes.

20 Claims, 5 Drawing Sheets

(51) Int. Cl.
  *H03H 9/72* (2006.01)
  *H04B 1/18* (2006.01)
  *H03H 9/02* (2006.01)
  *H04B 1/00* (2006.01)

(52) U.S. Cl.
  CPC ........ *H03H 9/6406* (2013.01); *H03H 9/6423* (2013.01); *H03H 9/6476* (2013.01); *H03H 9/6483* (2013.01); *H03H 9/725* (2013.01); *H04B 1/0057* (2013.01); *H04B 1/18* (2013.01)

(58) Field of Classification Search
  CPC ............... H03H 9/6423; H03H 9/6406; H03H 9/02574; H04B 1/0057; H04B 1/18
  USPC .......................... 333/133, 193–196; 310/364
  See application file for complete search history.

(56) References Cited

U.S. PATENT DOCUMENTS

| | | |
|---|---|---|
| 2013/0162368 A1 | 6/2013 | Tsurunari et al. |
| 2013/0300519 A1 | 11/2013 | Tamasaki et al. |
| 2015/0341076 A1 | 11/2015 | Uejima |
| 2016/0197643 A1 | 7/2016 | Uejima |

FOREIGN PATENT DOCUMENTS

| | | |
|---|---|---|
| WO | 2007/097186 A1 | 8/2007 |
| WO | 2012/098816 A1 | 7/2012 |
| WO | 2012/176455 A1 | 12/2012 |
| WO | 2014/125980 A1 | 8/2014 |
| WO | 2015/041125 A1 | 3/2015 |

\* cited by examiner

ELASTIC WAVE DEVICE, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-097006 filed on May 13, 2016 and is a Continuation Application of PCT Application No. PCT/JP2017/008839 filed on Mar. 6, 2017. The entire contents of each application are hereby incorporated herein by reference.

BACKGROUND OF THE INVENTION

1. Field of the Invention

The present invention relates to an elastic wave device including an elastic wave resonator that uses Rayleigh waves propagating on a piezoelectric substrate made of $LiNbO_3$, a radio-frequency front-end circuit, and a communication device.

2. Description of the Related Art

International Publication No. 2007/097186 discloses a band-pass filter that uses Rayleigh waves propagating on a $LiNbO_3$ substrate. The band-pass filter described in International Publication No. 2007/097186 includes IDT electrodes on the $LiNbO_3$ substrate. A silicon oxide film for temperature compensation covers the IDT electrodes.

In recent years, cellular phones have used carrier aggregation (CA) for faster communication. In other words, they utilize multiple frequency bands to increase the bitrate.

In technologies such as carrier aggregation, multiple band-pass filters are connected to an antenna common terminal. Unlike known duplexers or similar devices, the pass band of a filter may be considerably apart from that of another. Assume that the band-pass filter described in International Publication No. 2007/097186, one that uses Rayleigh waves, is utilized as the filter with the lower pass band frequency in such a case. This results in the excitation of not only Rayleigh waves but also higher-order modes, such as Sezawa waves. If the frequencies of these higher-order modes overlap the pass band of the higher-pass-band filter connected to the same terminal, the filter characteristics of the high-band-pass filter are degraded.

After various studies on this problem, the inventors of preferred embodiments of the present invention discovered that when IDT electrodes of a filter using Rayleigh waves on a $LiNbO_3$ substrate include a Pt film, the thickness of the Pt film has an impact on the fractional bandwidth of Sezawa waves and other higher-order modes. The studies therefore have revealed for the first time that the fractional bandwidth of Sezawa waves and other higher-order modes is influenced by the thickness of not only a silicon oxide film but also a Pt film.

When using Rayleigh waves on $LiNbO_3$, it is necessary to design the thickness of a Pt film so that the characteristics of filtering with Rayleigh waves will be good. The fractional bandwidth of Sezawa waves, however, is also influenced by the thickness of the Pt film. This has made it difficult for a band-pass filter with a relatively low frequency to combine good characteristics of filtering with Rayleigh waves and a small fractional bandwidth of Sezawa waves.

SUMMARY OF THE INVENTION

Preferred embodiments of the present invention provide elastic wave devices in each of which a filter having a relatively low pass band achieves good filtering characteristics with Rayleigh waves with less degradation of the filter characteristics of a filter having a higher pass band.

According to a preferred embodiment of the present invention, an elastic wave device includes an antenna common terminal to be connected to an antenna, a first band-pass filter that is connected to the antenna common terminal and has a first pass band, and a second band-pass filter that is connected to the antenna common terminal and has a second pass band, the second pass band being in a higher frequency band than the first pass band. The first filter includes at least one elastic wave resonator, and the elastic wave resonator includes a substrate including a piezoelectric layer made of $LiNbO_3$, IDT electrodes disposed on the piezoelectric layer and including a Pt film, and a silicon oxide film covering the IDT electrodes. The thickness D of the silicon oxide film is about 33% or less of $\lambda$, where $\lambda$ is the wavelength, which is determined by the finger pitch of the IDT electrodes.

In an elastic wave device according to a preferred embodiment of the present invention, the thickness D of the silicon oxide film is about 21% or more of the wavelength $\lambda$. In this case, the absolute temperature coefficient of acoustic velocity (TCVa) is small, with TCVa being about $-50$ ppm/° C. or higher.

In an elastic wave device according to a preferred embodiment of the present invention, the thickness D of the silicon oxide film is about 31% or less of the wavelength $\lambda$. This reduces the fractional bandwidth of Sezawa waves to about 0.05% or less.

In an elastic wave device according to a preferred embodiment of the present invention, the IDT electrodes include a low-electrical-resistance layer having a lower electrical resistance than the Pt film. This reduces the insertion loss.

In an elastic wave device according to a preferred embodiment of the present invention, the IDT electrodes include an adhesive layer in contact with the $LiNbO_3$ piezoelectric layer, the Pt film on the adhesive layer, a diffusion barrier layer on the Pt film, and the low-electrical-resistance layer on the diffusion barrier layer. This more effectively improves the filter characteristics and reduces the insertion loss.

In an elastic wave device according to a preferred embodiment of the present invention, the adhesive layer is made of at least one metal of NiCr, Cr, and Ti, the diffusion barrier layer is made of Cr or Ti, and the low-electrical-resistance layer is made of Al or an Al-based alloy.

In an elastic wave device according to a preferred embodiment of the present invention, the first filter is one of a ladder filter, a longitudinally coupled resonator elastic wave filter, and a filter including a ladder filter and a longitudinally coupled resonator elastic wave filter connected together.

In an elastic wave device according to a preferred embodiment of the present invention, when the first filter is a ladder filter or a filter including a ladder filter and a longitudinally coupled resonator elastic wave filter connected thereto, the ladder filter includes series-arm resonators, and the elastic wave resonator including the piezoelectric layer made of $LiNbO_3$ is at least one of the series-arm resonators.

In an elastic wave device according to a preferred embodiment of the present invention, all of the series-arm resonators of the ladder filter are the elastic wave resonators including the piezoelectric layer made of $LiNbO_3$. This further reduces the fractional bandwidth of Sezawa waves and further improves the filter characteristics of the second filter.

In an elastic wave device according to a preferred embodiment of the present invention, the at least one elastic wave resonator, including the piezoelectric layer made of $LiNbO_3$, is a series-arm resonator proximate to the antenna common terminal. This effectively reduces the fractional bandwidth of higher-order modes at the series-arm resonator proximate to the antenna common terminal. As a result, the filter characteristics of the second filter are more effectively improved.

In an elastic wave device according to a preferred embodiment of the present invention, the first filter is a receive filter for Band 1 or Band 7, and the second filter is a receive filter for Band 25 or Band 41.

A radio-frequency front-end circuit according to a preferred embodiment of the present invention includes an elastic wave device according to a preferred embodiment of the present invention.

A communication device according to a preferred embodiment of the present invention includes an elastic wave device according to a preferred embodiment of the present invention.

Elastic wave devices, radio-frequency front-end circuits, and communication devices according to preferred embodiments of the present invention provide a reduced fractional bandwidth of Sezawa waves and other higher-order modes at the first filter and, therefore, improved filter characteristics of the second filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the drawings to make the invention clearly understood.

It is to be noted that the preferred embodiments described herein are illustrative and partial replacement or combination of the configurations between different preferred embodiments is possible.

Figure 1:
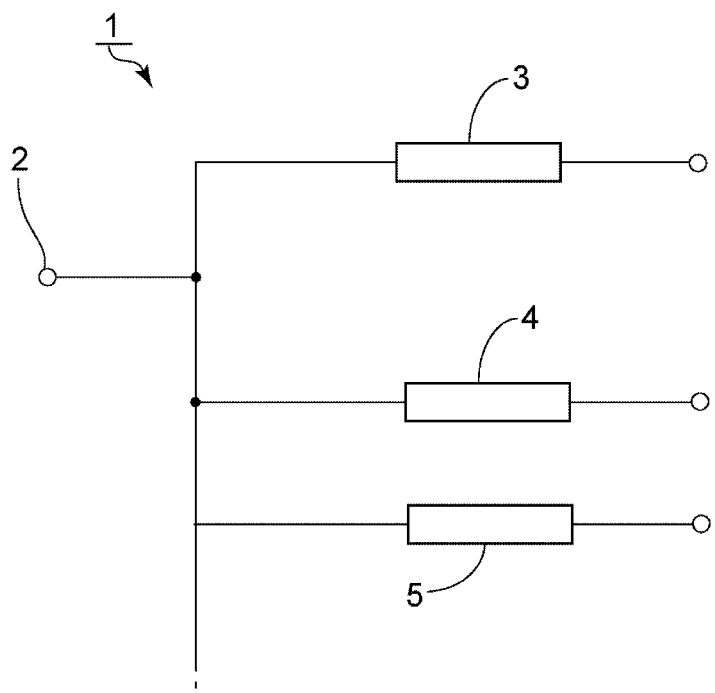
FIG. 1 is a schematic circuit diagram for an elastic wave device according to Preferred Embodiment 1 of the present invention.
Figure 2:
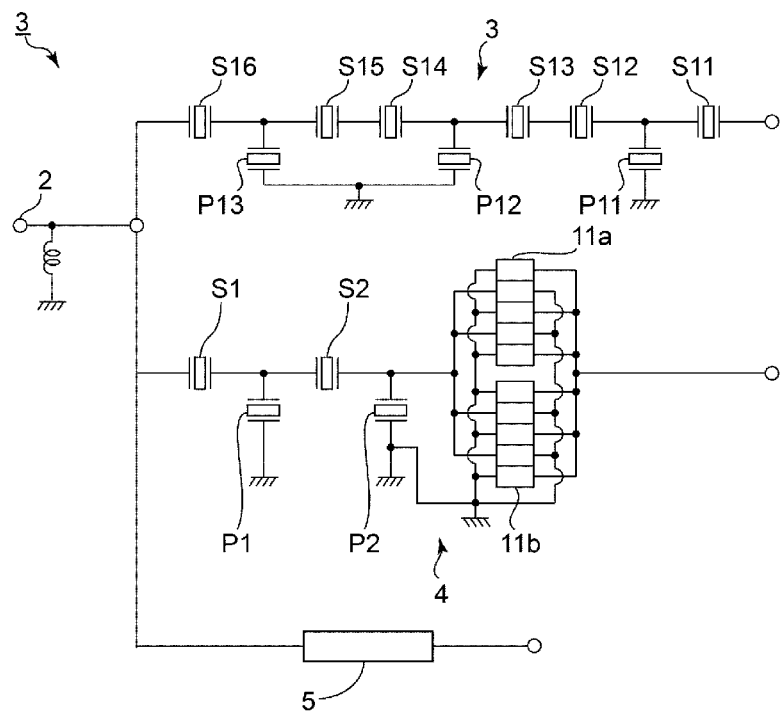
FIG. 2 is a circuit diagram for an elastic wave device according to Preferred Embodiment 1 of the present invention.

FIG. 1 is a schematic circuit diagram for an elastic wave device according to Preferred Embodiment 1 of the present invention, and FIG. 2 is a more detailed representation of the circuit diagram.

As illustrated in FIG. 1, the elastic wave device 1 includes an antenna common terminal 2 to be connected to an antenna. First to third filters 3 to 5 are connected at one end to the antenna common terminal 2. That is, the first to third filters 3 to 5 are bundled together. The first to third filters 3 to 5 are band-pass filters.

In the present preferred embodiment, for example, the first filter 3 preferably is a receive filter for Band 3, the second filter 4 preferably a receive filter for Band 40, and the third filter 5 preferably a receive filter for Band 39.

As illustrated in FIG. 2, the first filter 3 is preferably a ladder filter including multiple series-arm resonators S11 to S16 and multiple parallel-arm resonators P11 to P13. In the first filter 3, the element proximate to the antenna common terminal 2 is the series-arm resonator S16.

Figure 3:
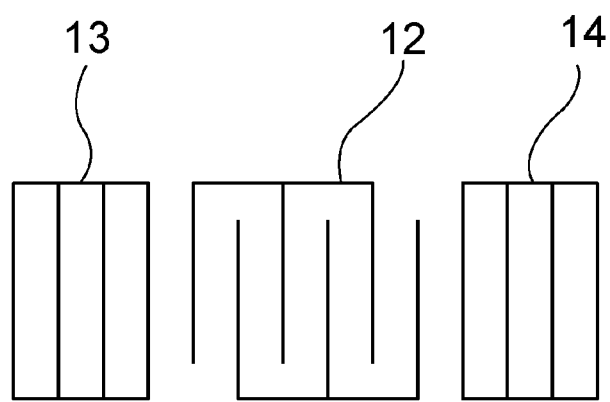
FIG. 3 is a plan view of the electrode structure of an elastic wave resonator used in the first filter of an elastic wave device according to Preferred Embodiment 1 of the present invention.

The series-arm resonators S11 to S16 and parallel-arm resonators P11 to P13 are all elastic wave resonators. The electrode structure of these elastic wave resonators is illustrated in plan view in FIG. 3. Reflectors 13 and 14 are provided on both sides of the IDT electrodes 12 in the direction of propagation of the elastic waves.

Figure 4:
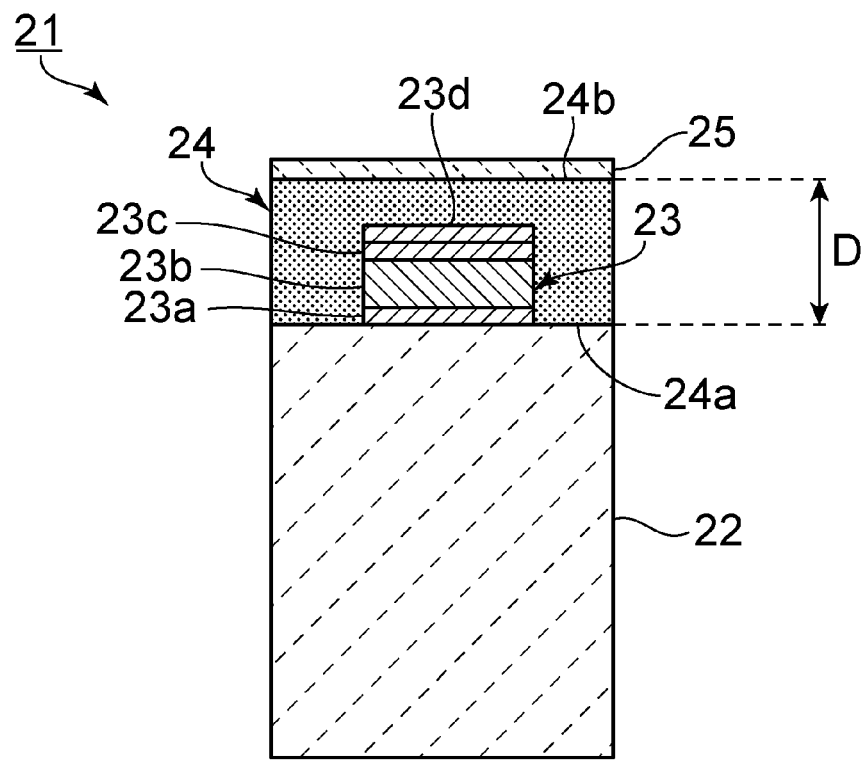
FIG. 4 is a partially enlarged front cross-section of an elastic wave resonator used in the first filter of an elastic wave device according to Preferred Embodiment 1 of the present invention.

FIG. 4 is a partially enlarged front cross-section of the elastic wave resonator, illustrating an enlarged view of where electrode fingers are present. The elastic wave resonator 21 preferably includes a $LiNbO_3$ substrate 22. On the $LiNbO_3$ substrate 22, IDT electrodes 23 are provided. In various preferred embodiments of the present invention, it may be that the entire substrate is a piezoelectric layer such as the $LiNbO_3$ substrate 22. Alternatively, the substrate may have a structure in which a piezoelectric layer is supported by a support substrate, for example, made of an insulating material. The only requirement here is that the IDT electrodes be in contact with the piezoelectric layer.

The IDT electrodes 23 include an adhesive layer 23a, a Pt film 23b, a diffusion barrier layer 23c, and a low-electrical-resistance layer 23d, from the $LiNbO_3$ substrate 22 side.

The adhesive layer 23a is preferably made of, for example, a metal that adheres to the $LiNbO_3$ substrate 22 more firmly than the Pt film 23b does. Examples of such metals include NiCr, Cr, and Ti.

The Pt film 23b may be a film of Pt or may be a film of a Pt-based alloy, which includes Pt and any other suitable metal element(s). The term "-based alloy" means that the alloy includes more than about 50% by weight Pt.

The diffusion barrier layer 23c prevents the diffusion of metals between the Pt film 23b and the low-electrical-resistance layer 23d. Such a diffusion barrier layer 23c may preferably be made of, for example, Ti or Cr.

The low-electrical-resistance layer 23d is made of a metal whose electrical resistance is low compared to that of Pt. Examples of such metals include Al and Al-based alloys.

On the low-electrical-resistance layer 23d, an electrode protection film, for example, a film of Ti may preferably be provided.

It is to be noted that in preferred embodiments of the present invention, the IDT electrodes may be of any type as long as they include a Pt film. Instead of being multilayer films as described above, they may be single-layer Pt films.

A silicon oxide film 24 covers the IDT electrodes 23. The silicon oxide film 24 is made of $SiO_x$ (x is an integer), for example, and in the present preferred embodiment is preferably a $SiO_2$ film. The silicon oxide film 24 is disposed on the $LiNbO_3$ substrate 22 and reduces the absolute TCVa. That is, the presence of the silicon oxide film 24 enables the absolute temperature coefficient TCVa of acoustic velocity to be small.

Furthermore, a silicon nitride film 25 is disposed on the silicon oxide film 24. The silicon nitride film 25 defines and functions as a protective film. The material for the protective film does not need to be silicon oxide and may be another dielectric material. Instead of the protective film, a frequency adjustment film may be provided.

It should be understood that as illustrated in FIG. 4, the thickness D of the silicon oxide film 24 is defined as the distance from the top surface of the $LiNbO_3$ substrate 22 to the top surface of the silicon oxide film 24.

Referring back to FIG. 2, the first filter 3 preferably has a first pass band F1 of about 1805 MHz to about 1880 MHz, for example.

In the second filter 4, longitudinally coupled resonator elastic wave filters 11a and 11b are connected in parallel. Each of the longitudinally coupled resonator elastic wave filters 11a and 11b is preferably a five-IDT longitudinally coupled resonator elastic wave filter, for example. The second filter 4 includes series-arm resonator S1 and S2 and parallel-arm resonators P1 and P2 on the antenna common terminal 2 side of the longitudinally coupled resonator elastic wave filters 11a and 11b. The series-arm resonators S1 and S2 and the parallel-arm resonators P1 and P2 define a series trap and a parallel trap, respectively.

The series-arm resonators S1 and S2 and parallel-arm resonators P1 and P2, preferably include a $LiNbO_3$ substrate, for example. It is to be noted that in preferred embodiments of the present invention, the circuit configuration of the second filter 4 is not critical.

The second filter 4 has a second pass band F2. In the present preferred embodiment, the second pass band F2 is preferably from about 2300 MHz to about 2400 MHz, for example. Therefore, the second pass band F2>the first pass band F1.

The third filter 5 has a third band pass F3. The circuit configuration of the third filter 5 is not critical. F3 may be a higher or lower frequency than F1.

For the second filter 4 and third filter 5, the circuit configuration is not critical. They may be band pass filters other than elastic wave filters.

In the present preferred embodiment, of first and second filters 3 and 4 satisfying the relation of F2>F1, the first filter 3 includes at least one elastic wave resonator 21. As described above, the elastic wave resonator 21 preferably includes a $LiNbO_3$ substrate 22. The IDT electrodes 23 preferably include a Pt film 23b, and a silicon oxide film 24 covers the IDT electrodes 23. When the elastic wave resonator 21 is excited, a dominant response appears as Rayleigh waves. The filter characteristics of the first filter 3 are based on these Rayleigh waves. The excited elastic wave resonator 21, however, produces not only Rayleigh waves but also Sezawa waves and other higher-order modes. This response in the form of Sezawa waves emerges near the second pass band F2 or within the second pass band F2.

In the present preferred embodiment, the thickness D of the silicon oxide film 24 is preferably, for example, about 33% or less of $\lambda$, where $\lambda$ is defined as the wavelength, which is determined by the finger pitch of the IDT electrodes 23. This reduces variations in the fractional bandwidth of the higher-order mode Sezawa waves according to the thickness of the Pt film 23b and also brings down the fractional bandwidth of the Sezawa waves. As a result, the filter characteristics of the second filter 4 are improved within its pass band. The following explains this in further detail with reference to FIGS. 5 to 9.

Figure 5:
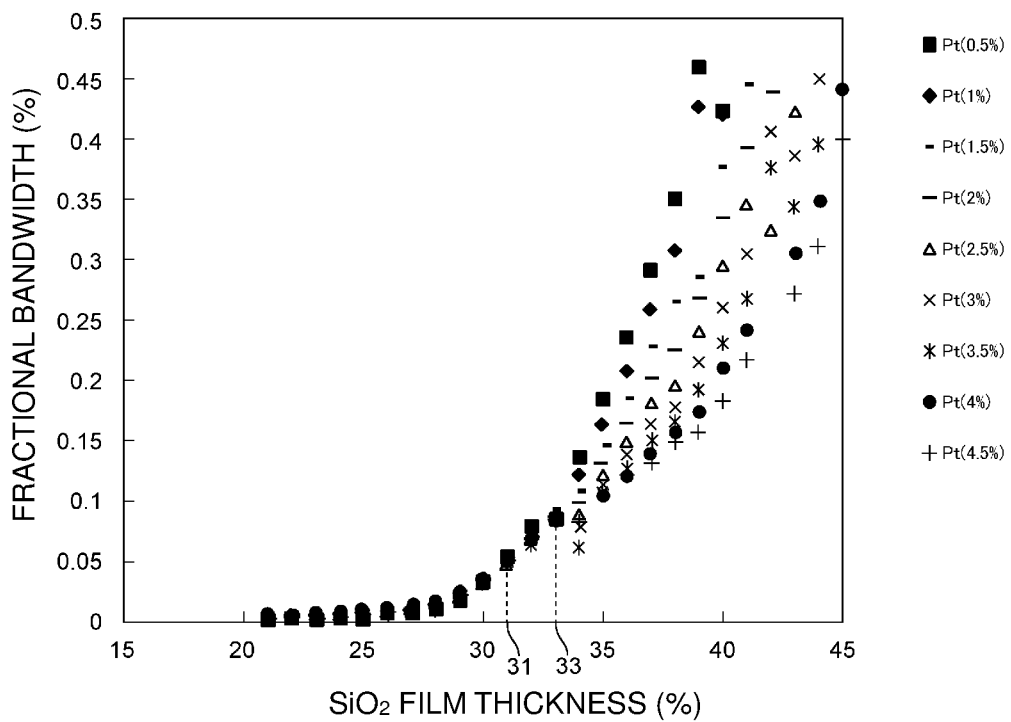
FIG. 5 is a diagram illustrating the relationship between the thickness of a $SiO_2$ film, the thickness of a Pt film, and the fractional bandwidth of Sezawa waves.

FIG. 5 is a diagram illustrating relationships between the thickness of the $SiO_2$ film that defines the silicon oxide film 24 and the fractional bandwidth of Sezawa waves for the elastic wave resonator 21. The thickness of the $SiO_2$ film was varied with the thickness of the Pt film 23b being about 0.5%, about 1%, about 1.5%, about 2%, about 2.5%, about 3%, about 3.5%, about 4%, or about 4.5%, for example.

The thicknesses of the Pt film 23b are also percentages of the wavelength $\lambda$, and the fractional bandwidths (%) of the Sezawa waves are calculated values (%) based on the results of a simulation of Sezawa waves in the respective structures.

As shown in FIG. 5, when the thickness of $SiO_2$ film preferably is about 33% or less of $\lambda$, for example, the fractional bandwidth is small regardless of the thickness of the Pt film. Moreover, variations in fractional bandwidth are very small because of the thickness of the Pt film. This indicates that setting the thickness of the $SiO_2$ film to about 33% or less of $\lambda$ will make it less likely that Sezawa-wave response will affect the filter characteristics. Additionally, since the fractional bandwidth of Sezawa waves varies very little with the thickness of the Pt film, the thickness of the Pt film may be selected for optimum filter characteristics of the first filter 3 within the first pass band. In this manner, the manufacturer is able to improve the filter characteristics of the first filter while preventing the degradation of the filter characteristics of the second filter.

Figure 6:
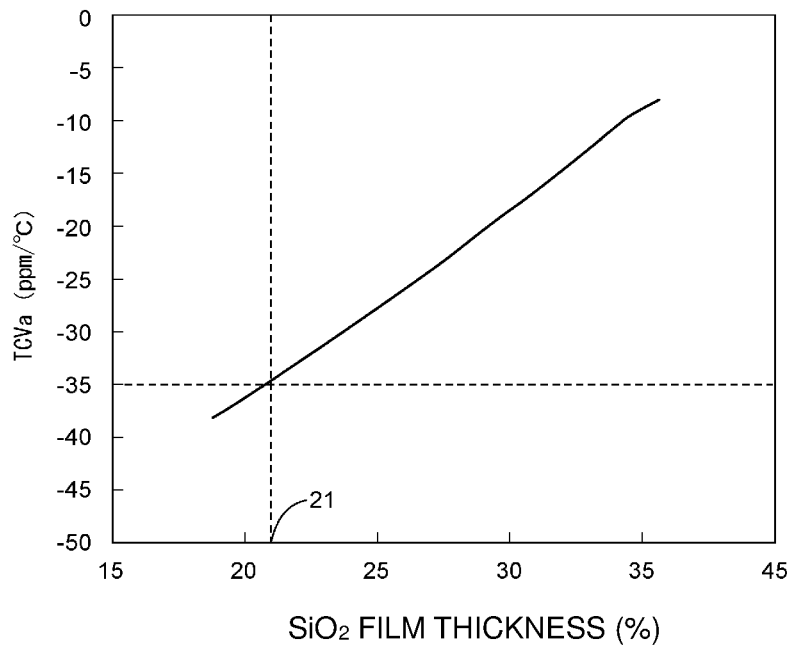
FIG. 6 is a diagram illustrating the relationship between the thickness of a $SiO_2$ film and TCVa.

FIG. 6 illustrates the relationship between the thickness of the $SiO_2$ film and TCVa.

As shown in FIG. 6, setting the thickness of the $SiO_2$ film to about 21% or more of $\lambda$ results in a TCVa of about −35 ppm/° C. or higher and, therefore, a small absolute temperature coefficient TCVa of acoustic velocity.

Thus, preferably, the thickness D of the silicon oxide film is, for example, about 21% or more of the wavelength $\lambda$.

More preferably, as is noticed from FIG. 5, the thickness of the $SiO_2$ film is, for example, about 31% or less of $\lambda$. This eliminates the variations in the fractional bandwidth of Sezawa waves according to the thickness of the Pt film almost completely, or further reduces the dependence of the fractional bandwidth of Sezawa waves on the thickness of the Pt film.

Figure 7:
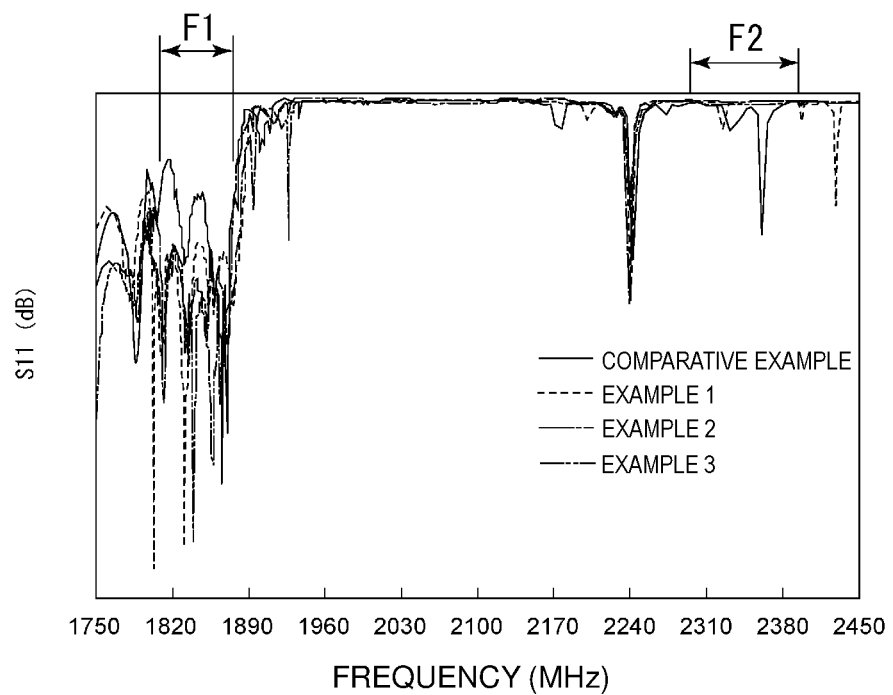
FIG. 7 is a diagram illustrating a reflection characteristic of the first filter for the elastic wave devices of Examples 1 to 3 of Preferred Embodiment 1 of the present invention and Comparative Example.

FIG. 7 is a diagram illustrating the reflection characteristic S11 of the first filter 3 for Examples 1 to 3 of Preferred Embodiment 1 and Comparative Example. In FIG. 7, the continuous line represents results for Comparative Example, the broken line for Example 1, the long-dashed short-dashed line for Example 2, and the long-dashed double-short-dashed line for Example 3.

The thickness (nm) of the $SiO_2$ film and wavelength-normalized thickness (%) in Examples 1 to 3 are presented in Table 1, below.

Table 1, below, also includes the magnitude of the Sezawa-wave response and fractional bandwidth of the Sezawa waves in the reflection characteristic S11 illustrated in FIG. 7.

TABLE 1

| | $SiO_2$ film thickness [nm] | $SiO_2$ film wavelength-normalized thickness [%] $\lambda = 1.85$ μm | Magnitude of Sezawa-wave response in the reflection characteristic S11 [dB] | Sezawa-wave fractional bandwidth [%] |
|---|---|---|---|---|
| Comparative Example | 670 | 36.2 | 12.56 | 0.169 |
| Example 1 | 570 | 30.8 | 2.87 | 0.039 |
| Example 2 | 470 | 25.4 | 0.85 | 0.007 |
| Example 3 | 370 | 20 | 0.91 | 0.004 |

In FIG. 7, the pass band F1 of the first filter and the pass band F2 of the second filter are also indicated.

As shown in FIG. 7, in Comparative Example, the Sezawa-wave response was comparatively large and located within the second pass band. By contrast, in Examples 1 to 3, the fractional bandwidth of Sezawa waves was very small, so small that the filter characteristics of the second filter are unlikely to be degraded.

In the first pass band F1, of the first filter, Examples 1 to 3 achieved a sufficiently large response. The Examples 1 to 3 therefore achieved an improvement in both the filter characteristics of the second filter and those of the first filter 3.

Figure 8:
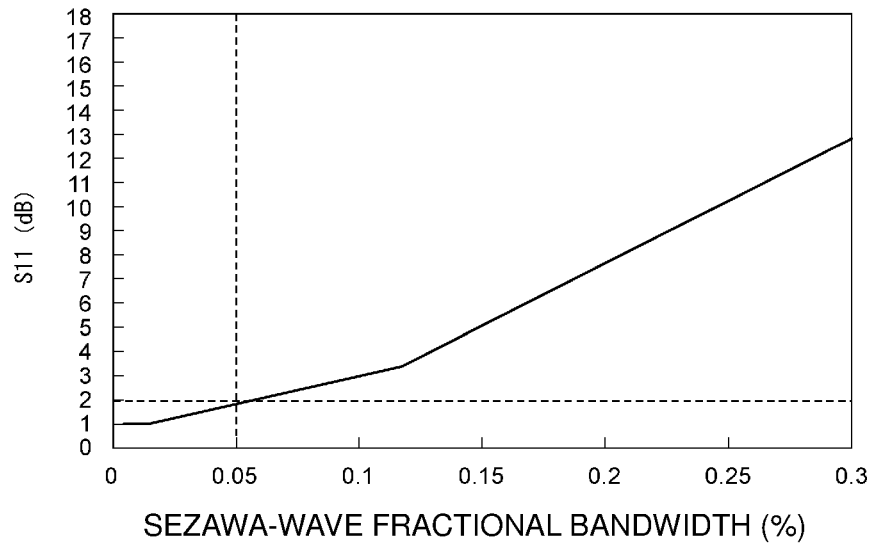
FIG. 8 is a diagram illustrating the relationship between the fractional bandwidth of Sezawa waves and a reflection characteristic.

FIG. 8 is a diagram illustrating the relationship between the fractional bandwidth of Sezawa waves and the reflection characteristic S11 of the first filter measured from the antenna common terminal side when the fractional bandwidth of Sezawa waves was varied over a wider range.

As shown in FIG. 8, the response of the reflection characteristic S11 decreases with reduced fractional bandwidth of Sezawa waves. FIG. 8 also indicates that, preferably, reducing the fractional bandwidth of Sezawa waves to about 0.05% or less, for example, will effectively reduce or prevent Sezawa waves, resulting in a reflection characteristic S11 of about 2.0 dB or less.

Although in the elastic wave device 1 in Preferred Embodiment 1, the first filter 3 and second filter 4 are preferably, for example, a receive filter for Band 3 and a receive filter for Band 40, respectively, the foregoing configuration is applicable to any appropriate filters for which F2>F1 and the Sezawa-wave response of the first filter 3 appears near the second pass band F2 or within the second pass band F2. An example of such a combination is a receive filter for Band 1 or Band 7 and a receive filter for Band 25 or Band 41.

Although the first filter 3 is preferably a ladder filter, it may have a structure in which a longitudinally coupled resonator elastic wave filter and a ladder filter are connected together, similar to the second filter 4. That is, the only requirements are that the first filter 3 includes at least one elastic wave resonator, that the at least one elastic wave resonator includes a piezoelectric layer made of $LiNbO_3$ and IDT electrodes disposed on the piezoelectric layer and including a Pt film, and that a silicon oxide film cover the IDT electrodes.

This means that by way of example, the at least one elastic wave resonator of the first filter 3 may be any of the series-arm resonators S11 to S16 and parallel-arm resonators P11 to P13. It is also preferable that all of the series-arm resonators S11 to S16 be the elastic wave resonators described above. When not all of the series-arm resonators S11 to S16 are the above-described elastic wave resonators, preferably, the series-arm resonator S16, proximate to the antenna common terminal 2 in the circuit configuration, or the series-arm resonator S16 on the antenna common terminal 2 side, be the above-described elastic wave resonator.

More preferably, all of the series-arm resonators S11 to S16 and parallel-arm resonators P11 to P13 are the above-described elastic wave resonators, in which the thickness D of the silicon oxide film is about 33% or less of $\lambda$.

The same applies to a filter circuit in which a ladder filter is connected to the antenna common terminal side of a longitudinally coupled resonator elastic wave filter. That is, it is preferable that the series-arm resonators connected to the antenna common terminal 2 side be at least the above-described elastic wave resonators described above, and, more preferably, it is desirable that all series-arm resonators be the above-described elastic wave resonators. Even more preferably, all of the resonators defining the ladder filter are the above-described elastic wave resonators.

It should be noted that although the above-described preferred embodiments limit the degradation of filter characteristics associated with response in the form of Sezawa waves as a higher-order mode, the reduction of the impact of a higher-order mode according to preferred embodiments of the present invention is achieved even when any other higher-order mode, other than Sezawa waves, is adjacent to the second pass band F2 or within the second pass band F2. That is, the higher-order mode does not need to be Sezawa waves.

Figure 9:
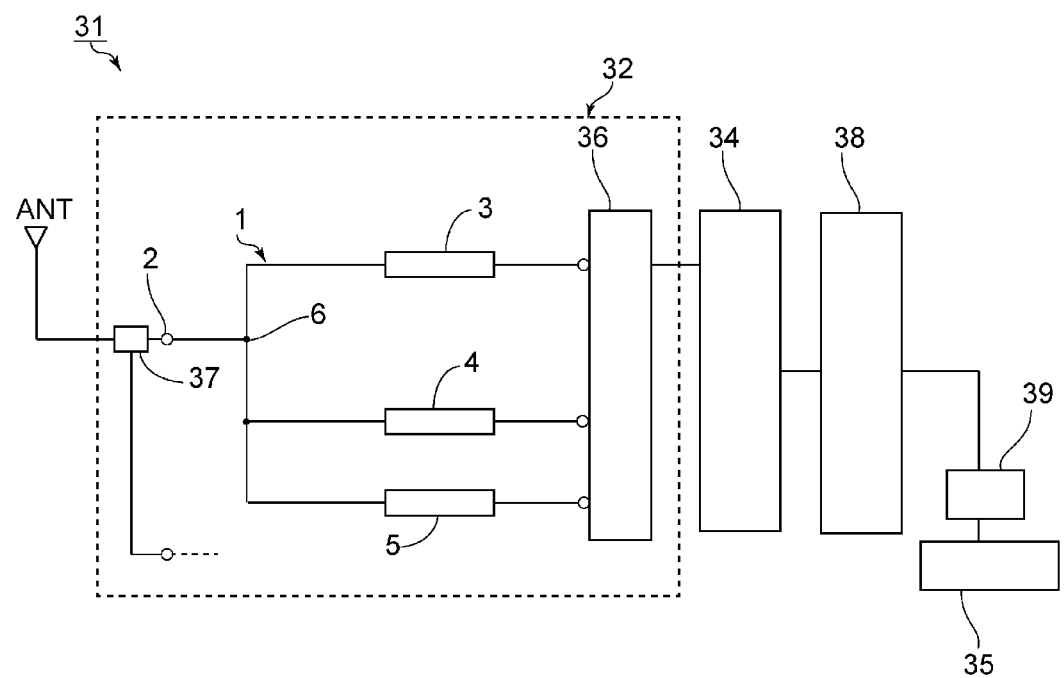
FIG. 9 is a block diagram illustrating a communication device as Preferred Embodiment 2 of the present invention.

FIG. 9 is a block diagram illustrating a communication device according to Preferred Embodiment 2 of the present invention. The communication device 31 includes first to third filters 3 to 5 connected at one end to an antenna common terminal 2 via a common node 6. To the other end of the first to third filters 3 to 5, an LNA 36 (Low Noise Amplifier) is connected. To the antenna common terminal 2, a switch 37 is connected. The section from this switch 37 to the LNA 36 is a radio-frequency front-end circuit 32. The LNA 36 of the radio-frequency front-end circuit 32 is connected to an RFIC 34. The RFIC 34 is connected to a BBIC 38 (Base Band IC), a CPU 39, and a display 35. The communication device 31 includes these radio-frequency front-end circuit 32, RFIC 34, BBIC 38, CPU 39, and display 35.

The radio-frequency front-end circuit 32 and communication device 31 each include an elastic wave device 1 according to a preferred embodiment of the present invention. The filter characteristics of the second filter 4 are therefore unlikely to be degraded by a Sezawa-wave response at the first filter 3. Moreover, since the Sezawa-wave response at the first filter 3 varies only to a small extent with the thickness of the Pt film as described above, the filter characteristics of the first filter 3 are also able to be improved by selecting the thickness of the Pt film. As a result, the radio-frequency front-end circuit 32 and communication device 31 are improved in terms of the filter characteristics of the first filter 3 and second filter 4.

It is to be noted that elastic wave devices according to preferred embodiments of the present invention may be widely applied to elastic waves using various elastic waves, such as surface acoustic wave devices and boundary acoustic wave device, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device that performs carrier aggregation, in which a plurality of frequency bands are used simultaneously, the elastic wave device comprising:
   an antenna common terminal to be connected to an antenna;
   a first band-pass filter is connected to the antenna common terminal and has a first pass band of the plurality of frequency bands; and
   a second band-pass filter that is connected to the antenna common terminal, and has a second pass band of the plurality of frequency bands, the second pass band being in a higher frequency band than the first pass band; wherein
   the first band-pass filter includes at least one elastic wave resonator;
   the at least one elastic wave resonator uses a Rayleigh wave and includes:
      a substrate including a piezoelectric layer made of $LiNbO_3$;
      IDT electrodes disposed on the piezoelectric layer and including a Pt film; and
      a silicon oxide film covering the IDT electrodes;
   a Sezawa wave as a higher-order mode of the Rayleigh wave overlaps the second pass band; and
   a thickness D of the silicon oxide film is about 33% or less of $\lambda$, where $\lambda$ is a wavelength determined by a finger pitch of the IDT electrodes.

2. The elastic wave device according to claim 1, wherein the thickness D of the silicon oxide film is about 21% or more of the wavelength $\lambda$.

3. The elastic wave device according to claim 1, wherein the thickness D of the silicon oxide film is about 31% or less of the wavelength $\lambda$.

4. The elastic wave device according to claim 1, wherein the IDT electrodes including a low-electrical-resistance layer having a lower electrical resistance than the Pt film.

5. The elastic wave device according to claim 4, wherein the IDT electrodes include an adhesive layer in contact with the piezoelectric layer made of $LiNbO_3$, the Pt film on the adhesive layer, a diffusion barrier layer on the Pt film, and the low-electrical-resistance layer on the diffusion barrier layer.

6. The elastic wave device according to claim 5, wherein the adhesive layer is made of at least one metal of NiCr, Cr, and Ti, the diffusion barrier layer is made of Cr or Ti, and the low-electrical-resistance layer is made of Al or an Al-based alloy.

7. The elastic wave device according to claim 1, wherein the first band-pass filter is one of a ladder filter, a longitudinally coupled resonator elastic wave filter, and a filter including a ladder filter and a longitudinally coupled resonator elastic wave filter connected together.

8. The elastic wave device according to claim 7, wherein when the first band-pass filter is a ladder filter or a filter including a ladder filter and a longitudinally coupled resonator elastic wave filter connected thereto, the ladder filter includes series-arm resonators, and the elastic wave resonator including the piezoelectric layer made of $LiNbO_3$ is at least one of the series-arm resonators.

9. The elastic wave device according to claim 8, wherein all of the series-arm resonators of the ladder filter are the elastic wave resonators including the piezoelectric layer made of $LiNbO_3$.

10. The elastic wave device according to claim 8, wherein the at least one elastic wave resonator, having the piezoelectric layer made of $LiNbO_3$, is a series-arm resonator proximate to the antenna common terminal.

11. The elastic wave device according to claim 1, wherein the first band-pass filter is a receive filter for Band 1 or Band 7;
   and the second band-pass filter is a receive filter for Band 25 or Band 41.

12. A radio-frequency front-end circuit comprising an elastic wave device according to claim 1.

13. The radio-frequency front-end circuit according to claim 12, wherein the thickness D of the silicon oxide film is about 21% or more of the wavelength $\lambda$.

14. The radio-frequency front-end circuit according to claim 12, wherein the thickness D of the silicon oxide film is about 31% or less of the wavelength $\lambda$.

15. The radio-frequency front-end circuit according to claim 12, wherein the IDT electrodes including a low-electrical-resistance layer having a lower electrical resistance than the Pt film.

16. The radio-frequency front-end circuit according to claim 15, wherein the IDT electrodes include an adhesive layer in contact with the piezoelectric layer made of $LiNbO_3$, the Pt film on the adhesive layer, a diffusion barrier layer on the Pt film, and the low-electrical-resistance layer on the diffusion barrier layer.

17. The radio-frequency front-end circuit according to claim 16, wherein the adhesive layer is made of at least one metal of NiCr, Cr, and Ti, the diffusion barrier layer is made of Cr or Ti, and the low-electrical-resistance layer is made of Al or an Al-based alloy.

18. The radio-frequency front-end circuit according to claim 12, wherein the first band-pass filter is one of a ladder filter, a longitudinally coupled resonator elastic wave filter, and a filter including a ladder filter and a longitudinally coupled resonator elastic wave filter connected together.

19. The radio-frequency front-end circuit according to claim 18, wherein when the first band-pass filter is a ladder filter or a filter including a ladder filter and a longitudinally coupled resonator elastic wave filter connected thereto, the ladder filter includes series-arm resonators, and the elastic wave resonator including the piezoelectric layer made of $LiNbO_3$ is at least one of the series-arm resonators.

20. A communication device comprising the elastic wave device according to claim 1.

* * * * *